(12) United States Patent
Kanamori

(10) Patent No.: US 6,828,206 B2
(45) Date of Patent: Dec. 7, 2004

(54) SEMICONDUCTOR DEVICE AND METHOD FOR FABRICATING THE SAME

(75) Inventor: Jun Kanamori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/398,189

(22) Filed: Sep. 17, 1999

(65) Prior Publication Data

US 2002/0009856 A1 Jan. 24, 2002

Related U.S. Application Data

(62) Division of application No. 09/342,751, filed on Jun. 29, 1999.

(51) Int. Cl.⁷ .................. H01L 21/8228; H01L 21/331; H01L 21/76
(52) U.S. Cl. ........................ 438/323; 438/354; 438/419; 438/422
(58) Field of Search ................................. 438/323, 354, 438/419, 422, 320, 517

(56) References Cited

U.S. PATENT DOCUMENTS

| 5,863,823 A | * | 1/1999 | Burgener | 438/295 |
| 5,946,595 A | | 8/1999 | Doan et al. | |
| 5,965,917 A | | 10/1999 | Maszara et al. | 257/347 |
| 5,994,191 A | | 11/1999 | Xiang et al. | 438/300 |
| 6,015,752 A | | 1/2000 | Xiang et al. | 438/655 |
| 6,165,903 A | | 12/2000 | Besser et al. | |

* cited by examiner

*Primary Examiner*—Long Pham
*Assistant Examiner*—Shrinivas H Rao
(74) *Attorney, Agent, or Firm*—Volentine Francos & Whitt, PLLC

(57) ABSTRACT

In a method for fabricating a semiconductor device, a silicide material is formed at least on the surface of an area to be silicided. Then, a first RTA (Rapid Thermal Annealing) process is performed to form a first-reacted silicide region. Next, a supplemental silicon layer is formed over the entire surface; and a second RTA process is performed to form a second-reacted suicide region.

18 Claims, 10 Drawing Sheets

⇩ Sputtering (TiN, Co)

⇩ 1st RTA

⇩ 2nd RTA

↓ Sputtering (TiN, Co)

↓ 1st RTA

⬇ 2nd RTA

⇩ Sputtering (TiN, Co)

⇩ 1st RTA

⇩ 2nd RTA

SEMICONDUCTOR DEVICE AND METHOD FOR FABRICATING THE SAME

CROSS REFERENCE TO RELATED APPLICATIONS

This is a divisional application of application Ser. No. 09/342,751, filed Jun. 29, 1999, which is hereby incorporated by reference in its entirety for all purposes.

BACKGROUND OF THE INVENTION

1. Field of the Invention

The present invention relates to semiconductor fabrication technology, and more particularly to a semiconductor device that is fabricated using SALICIDE (Self Aligned Silicide) process.

2. Description of the Background Art

In recent years, semiconductor devices have been miniaturized and improved in performance, and at the same time, system LSIs have been proposed. In such a system LSI, for improving its performance, it is required to decrease resistance of a gate pattern and active regions of source and drain. As shown in "Semiconductor World", May 1998, page 66, salicide process has been used to decrease that resistance. Especially for SOI (Silicon-On-Insulator) type of devices, the salicide process is important. SOI technology has become increasingly important in the field of integrated circuits. In SOI fabrication, a layer of semiconductor material overlies an insulating layer, typically, a single crystal layer of silicon overlies a layer of silicon dioxide, which itself overlies a silicon substrate.

According to a conventional method, a BOX (Buried Oxide) layer is formed on a silicon substrate. Next, a field oxide layer and a SOI (Silicon on Insulator) layer are formed on the BOX layer. The SOI layer is usually designed to have a thickness of 50 nm to 100 nm. A gate oxide layer is formed on the SOI layer, and a poly-silicon gate layer is formed on the gate oxide layer. A gate side wall layer is formed on the SOI layer to surround the poly-silicon gate layer and gate oxide layer.

Before a first RTA (Rapid Thermal Annealing) process, thus fabricated structure is covered with Co (cobalt) layer and TiN (Titanium Nitride) layer. In the first RTA process, silicide reaction occurs at the junction area between the SOI layer and the Co layer, and between the poly-silicon gate layer and the Co layer, so that the SOI layer and gate layer are silicided. The silicide regions are of CoSi, which still have a high resistance. After the first RTA process, the remaining metal (Co and TiN) are selectively removed by a wet process using such as ammonia water or hydrogen peroxide solution.

Next, the second RTA process is carried out so that silicon in the SOI layer and poly-silicon gate layer again react with the silicide regions. As a result, the silicide regions become to be of $CoSi_2$, which have lower resistance.

According to the above described conventional method, low resistance wiring can be realized by the salicide process. For further improving performance of SOI devices, it is required to make the SOI layer much thinner, for example less than 70 nm. If the SOI layer is formed to have irregular thickness, thinner parts of the SOI layer may be salicided entirely and voids may be made in the SOI layer. If voids are made in the SOI layer, the BOX layer may be etched when contact holes are formed on the active areas. If the silicon substrate is etched as well in worst case, the silicon substrate is electrically connected to the upper electrode. As a result, undesirable electrical leakage is made.

SUMMARY OF THE INVENTION

Accordingly, an object of the present invention is to improve quality of a semiconductor device even if a SOI layer is designed to be very thin.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

According to a first aspect of the present invention, in a method for fabricating a semiconductor device, a silicide material is formed at least on the surface of an area to be silicided. Then, a first RTA (Rapid Thermal Annealing) process is performed to form a first-reacted suicide region. Next, a supplemental silicon layer is formed over the entire surface; and a second RTA process is performed to form a second-reacted silicide region.

The main feature of the present invention is to form the supplemental silicon layer over the entire surface prior to the second RTA process. According to the present invention, silicon for silicide process is also provided from the supplemental silicon layer in the second RTA process. As a result, low resistance wiring can be well realized by the salicide process even if an SOI layer is formed to be thinner. Consequently, the fabricated semiconductor device is prevented from having a problem of electrical leakage.

The silicide material may include cobalt (Co) or titanium (Ti). The supplemental silicon layer may be of poly-silicon formed by CVD (Chemical Vapor Deposition) technique. The supplemental silicon layer may be of a-Si (amorphous silicon) formed by sputtering technique.

An impurity may be doped into the supplemental silicon layer before the second RTA process, wherein the impurity is of the same type as active regions. When such an impurity is doped into the supplemental silicon layer, the remaining (non-reacted) silicon can be removed at a high etching rate and high selectivity after the second RTA process. Further, the type of impurity is the same as that of the impurity doped into the corresponding active region, so that the silicide reaction progresses smoothly.

The impurity may be doped into one of N-channel region and P-channel region. When impurity is doped one of N and P channel regions, the silicide reaction can be well controlled between the N-channel region and P-channel region.

According to a second aspect of the present invention, a semiconductor device is fabricated by the above described method of the first aspect of the present invention.

DETAILED DISCLOSURE OF THE INVENTION

Figure 1A:
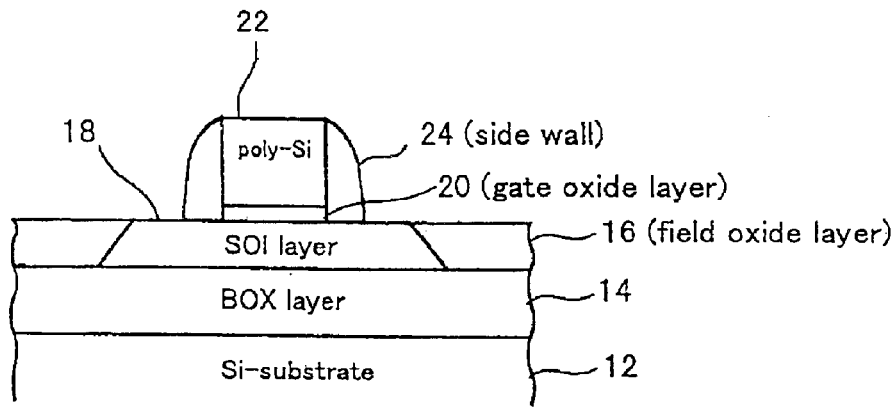
FIGS. 1A to 1C are cross-sectional views showing fabrication steps of a semiconductor device according to a conventional technique.
Figure 1B:
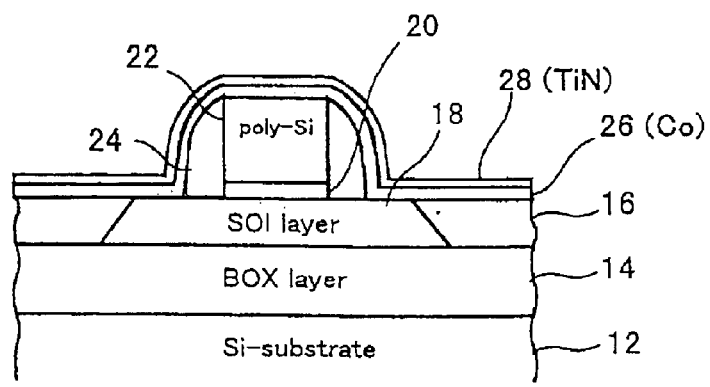
Figure 1C:
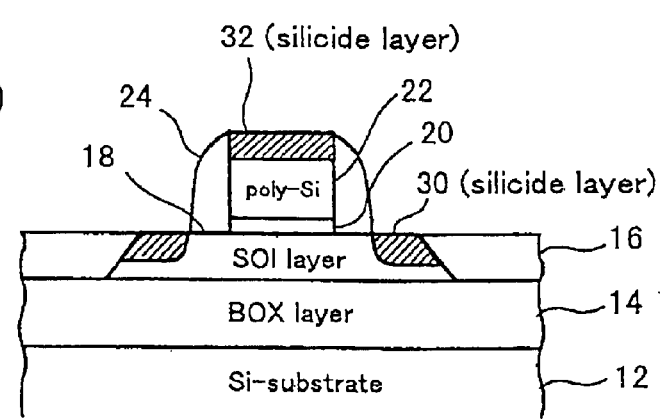

For better understanding of the present invention, a conventional technology is first described. FIGS. 1A to 1C are cross-sectional views showing fabrication steps of a conventional semiconductor device. FIGS. 1A to 1C show salicide process of a SOI (Silicon on Insulator) type of semiconductor device.

FIG. 1A shows a condition in which gate-side-wall process is completed. As shown in FIG. 1A, a BOX (Buried Oxide) layer 14 is formed on a silicon substrate 12 to have a thickness of 100 nm to 200 nm. A field oxide layer 16 and a SOI (Silicon on Insulator) layer 18 are formed on the BOX layer 14. The SOI layer 18 is of FD (Fully Depletion) type and is designed to have a thickness of 50 nm to 100 nm. A gate oxide layer 20 is formed on the SOI layer 18 to have a thickness of 3.5 nm to 7.0 nm. A poly-silicon gate layer 22 is formed on the gate oxide layer 20 to have a thickness of 150 nm to 250 nm. A gate side wall layer 24 is formed on the SOI layer 18 to surround the poly-silicon gate layer 22 and gate oxide layer 20. The gate side wall layer 24 is designed to have a width of 80 nm to 150 nm.

FIG. 1B shows a condition in that the structure, shown in FIG. 1A, is covered with Co (cobalt) layer 26 and TiN (Titanium Nitride) layer 28 by sputtering process. The Co layer 26 is formed over the entire structure to have a thickness of 5 nm to 12 nm. The TiN layer 28 is formed over the Co layer 26 to have a thickness of 5 nm to 10 nm. The TiN layer 28 functions for controlling salicide process.

FIG. 1C shows a condition in that first and second RTA (Rapid Thermal Annealing) processes are carried out to the structure, shown in FIG. 1B. In the first RTA process of 500 to 600° C., silicide reaction occurs at the junction area between the SOI layer 18 and the Co layer 26, and between the poly-silicon gate layer 22 and the Co layer 26, so that silicide regions 30 and 32 are formed.

After the first RTA process, the remaining metal (Co and TiN) are selectively removed by a wet process using such as ammonia water or hydrogen peroxide solution. The silicide regions 30 and 32 are of CoSi, which still have a high resistance.

Next, the second RTA process is carried out at a temperature of 750 to 850° C. so that silicon in the SOI layer 18 and poly-silicon gate layer 22 again react with the silicide regions 30 and 32, respectively. As a result, the suicide regions 30 and 32 become to be of $CoSi_2$, which have lower resistance.

According to the above described conventional method, low resistance wiring can be realized by the salicide process. For more improving performance of SOI devices, it is required to make the SOI layer 18 much thinner, for example less than 70 nm. If the SOI layer 18 is formed to have irregular thickness, thinner part of the SOI layer 18 may be salicided entirely and voids may be made in the SOI layer 18. If voids are made in the SOI layer 18, the BOX layer 14 may be etched when contact holes are formed on the active area (30). If the silicon substrate 12 is etched as well in worst case, the silicon substrate 12 is electrically connected to the upper electrode. As a result, undesirable electrical leakage is made.

FIGS. 2A to 2E are cross-sectional views showing fabrication steps of a semiconductor device according to a first preferred embodiment of the present invention. FIGS. 2A to 2E show salicide process of a SOI (Silicon on Insulator) type of semiconductor device.

Figure 2A:
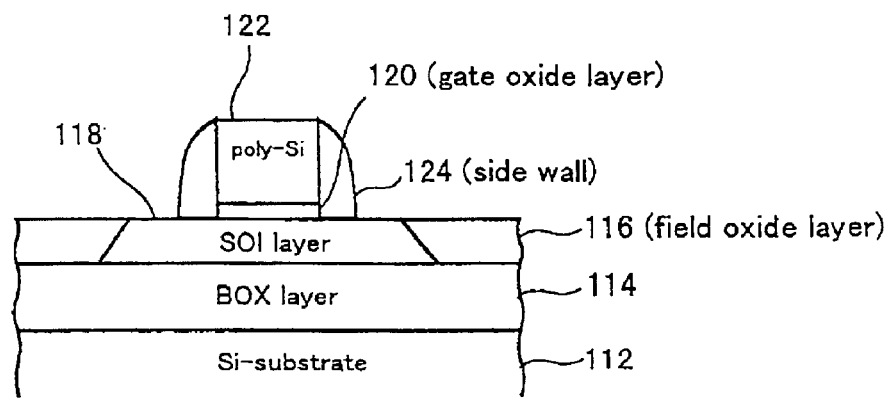
FIGS. 2A to 2E are cross-sectional views showing fabrication steps of a semiconductor device according to a first preferred embodiment of the present invention.

FIG. 2A shows a condition in which gate-side-wall process is completed. As shown in FIG. 2A, a BOX (Buried Oxide) layer 114 is formed on a silicon substrate 112 to have a thickness of 100 nm to 200 nm. A field oxide layer 116 and a SOI (Silicon on Insulator) layer 118 are formed on the BOX layer 114. The SOI layer 118 is of FD (Fully Depletion) type and is designed to have a thickness of 50 nm to 100 nm. A gate oxide layer 120 is formed on the SOI layer 118 to have a thickness of 3.5 nm to 7.0 nm. A poly-silicon gate layer 122 is formed on the gate oxide layer 120 to have a thickness of 150 nm to 250 nm. A gate side wall layer 124 is formed on the SOI layer 118 to surround the poly-silicon gate layer 122 and gate oxide layer 120. The gate side wall layer 124 is designed to have a width of 80 nm to 150 nm.

Figure 2B:
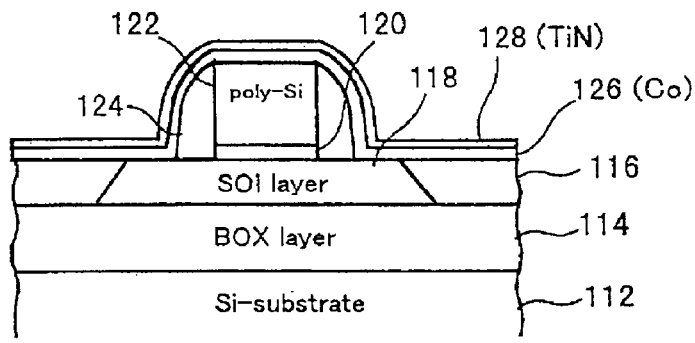

FIG. 2B shows a condition in that the structure, shown in FIG. 2A, is covered with Co (cobalt) layer 126 and TiN (Titanium Nitride) layer 128 by sputtering process. The Co layer 126 is formed over the entire structure to have a thickness of 5 nm to 12 nm. The TiN layer 128 is formed over the Co layer 126 to have a thickness of 5 nm to 10 nm. The TiN layer 128 functions for controlling salicide process.

Figure 2C:
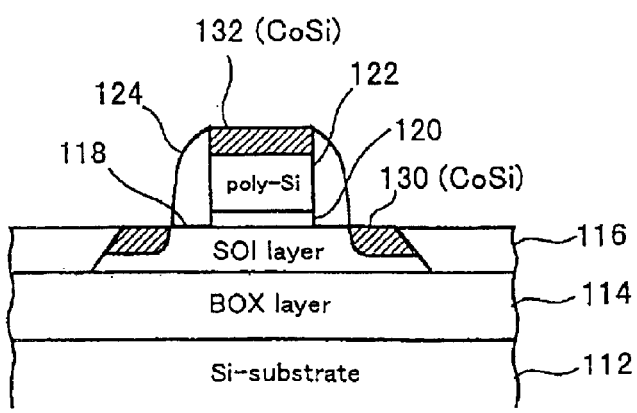

FIG. 2C shows a condition in that a first RTA (Rapid Thermal Annealing) process is carried out to the structure. The first RTA process is carried out at 500 to 600° C., so that silicide reaction occurs at the junction area between the SOI layer 118 and the Co layer 126, and between the poly-silicon gate layer 122 and the Co layer 126. As a result of the first RTA process, silicide regions 130 and 132 are formed. The silicide regions 130 and 132 can be called "higher-resistance silicide regions" or "first-reacted silicide regions". The silicide regions 130 and 132 are of CoSi, which still have a higher resistance. After the first RTA process, the remaining metal (Co and TiN) are selectively removed by a wet process using such as ammonia water or hydrogen peroxide solution.

Figure 2D:
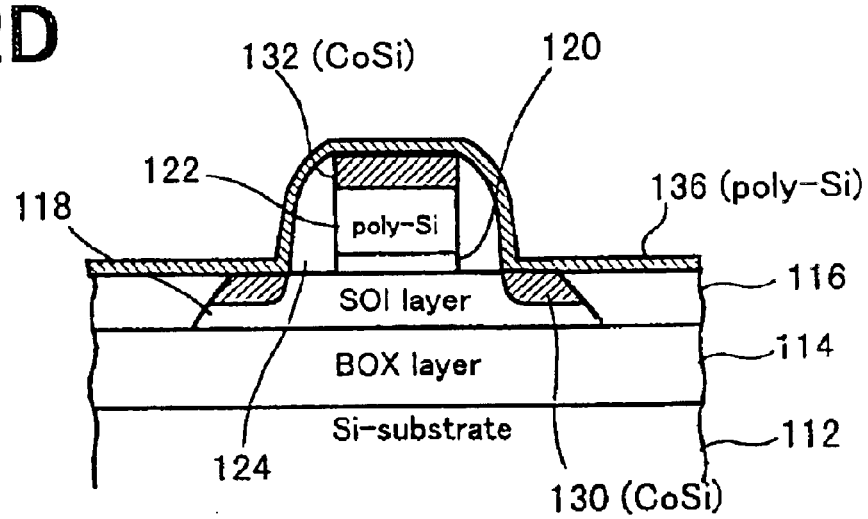
Figure 2E:
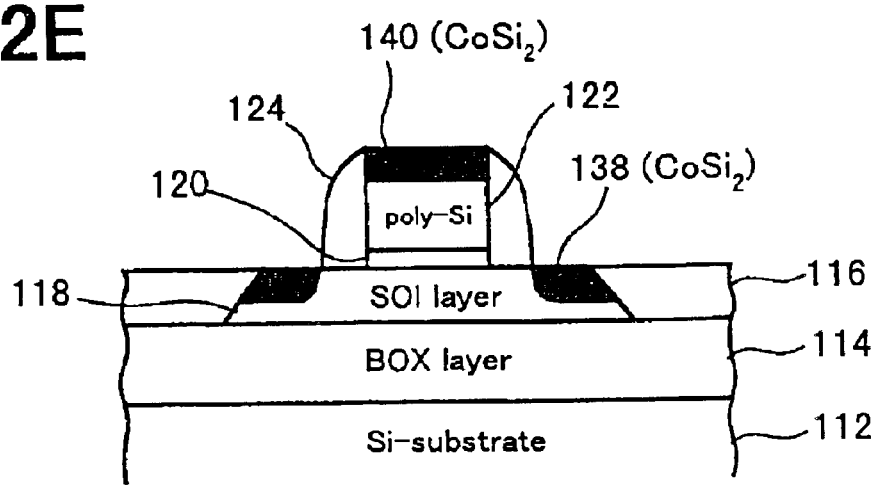

Before a second RTA process, a poly-silicon layer 136 is formed over the entire structure, as a supplemental silicon layer, as shown in FIG. 2D. The poly-silicon layer 136 is formed by CVD (Chemical Vapor Deposition) process at a temperature of 350 to 500° C. to have a thickness of 5 nm to 10 nm.

Next, a second RTA process is carried out at a temperature of 750 to 850° C. In the second RTA process, silicon contained in the SOI layer 118 and poly-silicon layer 136 reacts with the silicide region 130, while silicon contained in the poly-silicon gate layer 122 and the poly-silicon layer 136 reacts with the silicide region 132. According to this embodiment, silicon for silicide process is provided not only from the SOI layer 118 and the poly-silicon gate layer 122 but also from the poly-silicon layer 136. Therefore, enough amount of silicon remains in the SOI layer 118 even after the second RTA process. As a result of the second RTA process, silicide regions 138 and 140 of $CoSi_2$, which have lower resistance, are formed. The silicide regions 138 and 140 can be called "lower-resistance silicide regions" or "second-reacted silicide regions".

After the second RTA process, the remaining metal (Co and TiN) are selectively removed from the silicide regions 138 and 140. Such removing process can be carried out by a wet process (dipping) using aquafortis or by plasma etching using a chlorine system gas or a fluorine system gas.

According to the first preferred embodiment, silicon for silicide process is provided not only from the SOI layer 118 and the poly-silicon gate layer 112 but also from the poly-silicon layer 136. As a result, enough amount of silicon remains in the SOI layer 118 after the second RTA process; and therefore, low resistance wiring can be realized by the salicide process even if the SOI layer 118 is formed to be much thinner, for example less than 70 nm. In other words, the BOX layer 114 is prevented from being etched when contact holes are formed on the active area (130). Consequently, the fabricated semiconductor device is prevented from having a problem of electrical leakage.

FIGS. 3A to 3E are cross-sectional views showing fabrication steps of a semiconductor device according to a second preferred embodiment of the present invention. FIGS. 2A to 2E show salicide process of a SOI (Silicon on Insulator) type of semiconductor device. According to the second preferred embodiment, an a-Si (amorphous silicon) layer is formed before second RTA process instead of the poly-silicon layer 136, shown in FIG. 2D, in the first preferred embodiment.

Figure 3A:
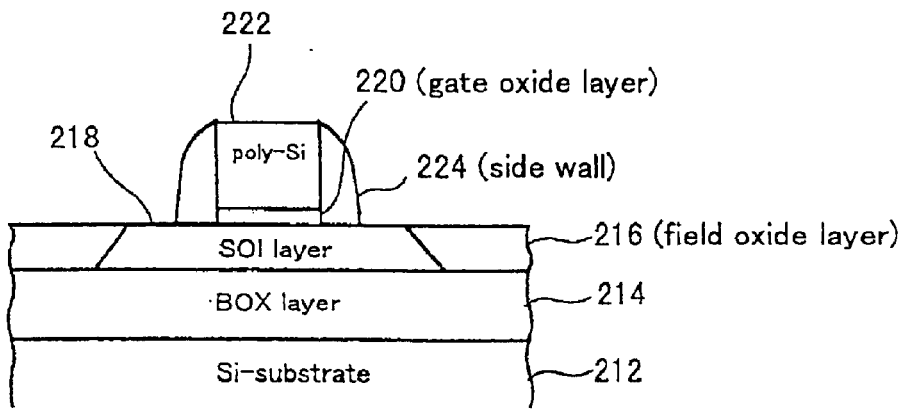
FIGS. 3A to 3E are cross-sectional views showing fabrication steps of a semiconductor device according to a second preferred embodiment of the present invention.

FIG. 3A shows a condition in which gate-side-wall process is completed. As shown in FIG. 3A, a BOX (Buried Oxide) layer 214 is formed on a silicon substrate 212 to have a thickness of 100 nm to 200 nm. A field oxide layer 216 and a SOI (Silicon on Insulator) layer 218 are formed on the BOX layer 214. The SOI layer 218 is of FD (Fully Depletion) type and is designed to have a thickness of 50 nm to 100 nm. A gate oxide layer 220 is formed on the SOI layer 218 to have a thickness of 3.5 nm to 7.0 nm. A poly-silicon gate layer 222 is formed on the gate oxide layer 220 to have a thickness of 150 nm to 250 nm. A gate side wall layer 224 is formed on the SOI layer 218 to surround the poly-silicon gate layer 222 and gate oxide layer 220. The gate side wall layer 224 is designed to have a width of 80 nm to 150 nm.

Figure 3B:
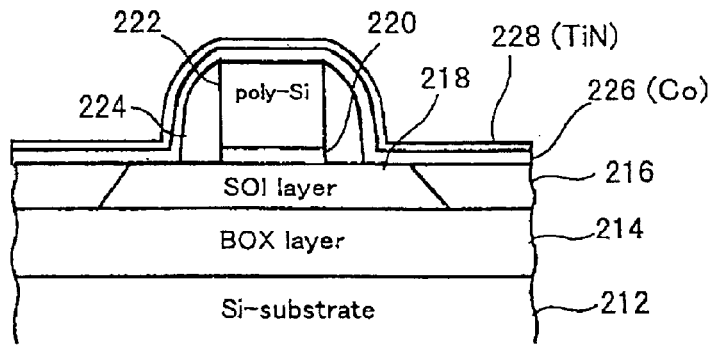

FIG. 3B shows a condition in that the structure, shown in FIG. 3A, is covered with Co (cobalt) layer 226 and TiN (Titanium Nitride) layer 228 by sputtering process. The Co layer 226 is formed over the structure to have a thickness of 5 nm to 12 nm. The TiN layer 228 is formed over the Co layer 226 to have a thickness of 5 nm to 10 nm. The TiN layer 228 functions for controlling salicide process.

Figure 3C:
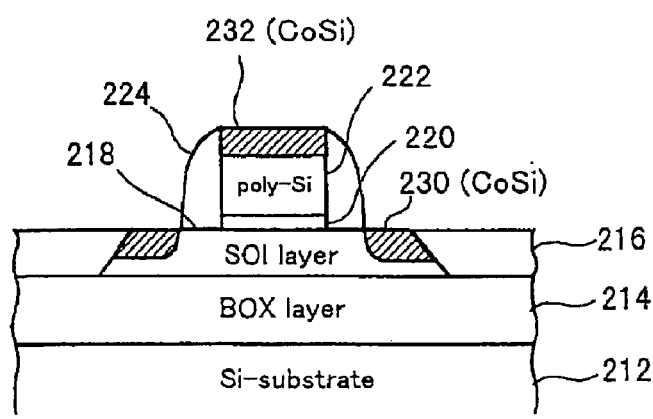

FIG. 3C shows a condition in that a first RTA (Rapid Thermal Annealing) process is carried out to the structure. The first RTA process is carried out at 500 to 600° C., so that silicide reaction occurs at the junction area between the SOI layer 218 and the Co layer 226, and between the poly-silicon gate layer 222 and the Co layer 226. As a result of the first RTA process, silicide regions 230 and 232 are formed. The silicide regions 230 and 232 can be called "higher-resistance silicide regions" or "first-reacted suicide regions". The silicide regions 230 and 232 are of CoSi, which still have a higher resistance. After the first RTA process, the remaining metal (Co and TiN) are selectively removed by a wet process using such as ammonia water or hydrogen peroxide solution.

Figure 3D:
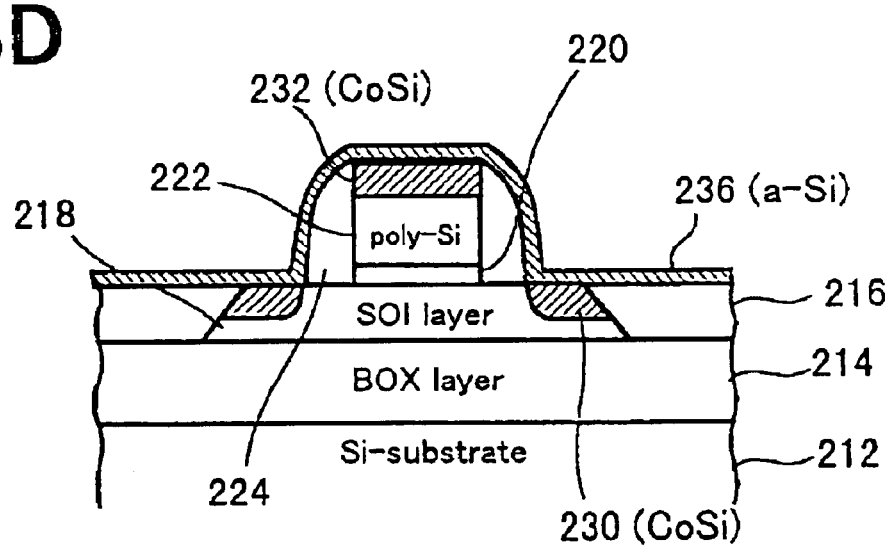
Figure 3E:
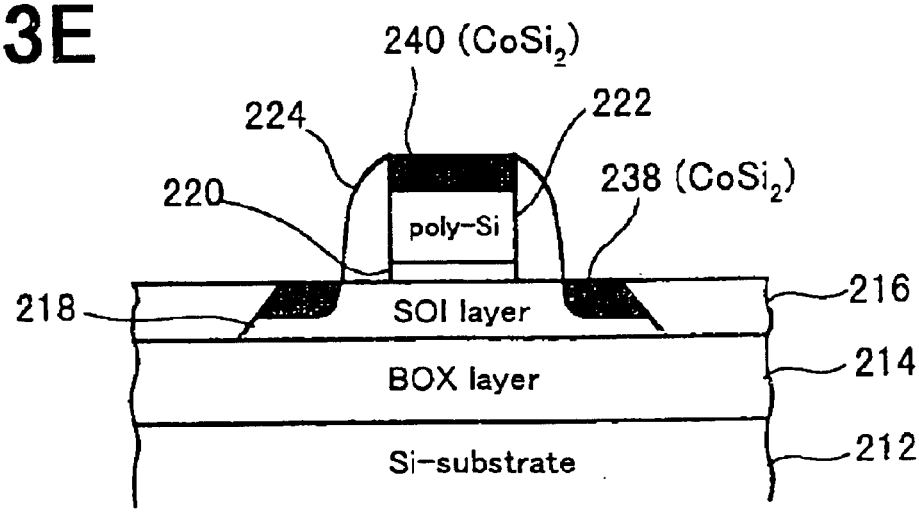

Before a second RTA process, an a-Si layer 236 is formed over the entire structure, as a supplemental silicon layer, as shown in FIG. 3D. The a-Si layer 236 is formed by sputtering process.

Next, a second RTA process is carried out at a temperature of 750 to 850° C. In the second RTA process, silicon contained in the SOI layer 218 and a-Si layer 236 again reacts with the silicide region 230, while silicon contained in the poly-silicon gate layer 222 and the a-Si layer 236 again reacts with the silicide region 232. According to this embodiment, silicon for suicide process is provided not only from the SOI layer 218 and the poly-silicon gate layer 222 but also from the a-Si layer 236. Therefore, enough amount of silicon remains in the SOI layer 218 even after the second RTA process. As a result of the second RTA process, silicide regions 238 and 240 of $CoSi_2$, which have lower resistance, are formed. The silicide regions 238 and 240 can be called "lower-resistance silicide regions" or "second-reacted silicide regions".

After the second RTA process, the remaining metal (Co, TiN and a-Si) are selectively removed from the silicide regions 238 and 240. Such removing process can be carried out by a wet process (dipping) using aquafortis or by plasma etching using a chlorine system gas or a fluorine system gas.

According to the second preferred embodiment, silicon for silicide process is provided not only from the SOI layer 218 and the poly-silicon gate layer 222 but also from the a-Si layer 236. As a result, enough amount of silicon remains in the SOI layer 218 after the second RTA process; and therefore, low resistance wiring can be realized by the salicide process even if the SOI layer 218 is formed to be much thinner, for example less than 70 nm. In other words, the BOX layer 214 is prevented from being etched when contact holes are formed on the active area (230). Consequently, the fabricated semiconductor device is prevented from having a problem of electrical leakage. Comparing to the first preferred embodiment, the a-Si layer 236 can be formed by a process at a lower temperature (less than 200° C.). Thus, a silicide reaction is more efficiently prevented from undesirably progressing before the second RTA process.

FIGS. 4A to 4E are cross-sectional views showing fabrication steps of a semiconductor device according to a third preferred embodiment of the present invention. FIGS. 4A to 4E show salicide process of a SOI (Silicon on Insulator) type of semiconductor device. According to the third preferred embodiment, a Ti (titanium) layer is formed before a first RTA process instead of the Co layer 126 (226), shown in FIGS. 2B and 3B, in the first and second preferred embodiments.

It is known that Titanium and Cobalt reacts with silicon in the different manner. When using titanium for salicide process, a $TiSi_2$ is formed in the first RTA process. Then, in the second RTA process, phase transition of C49 to C54 occurs in the suicide regions, so that the resistance of the silicide regions is lowered.

Figure 4A:
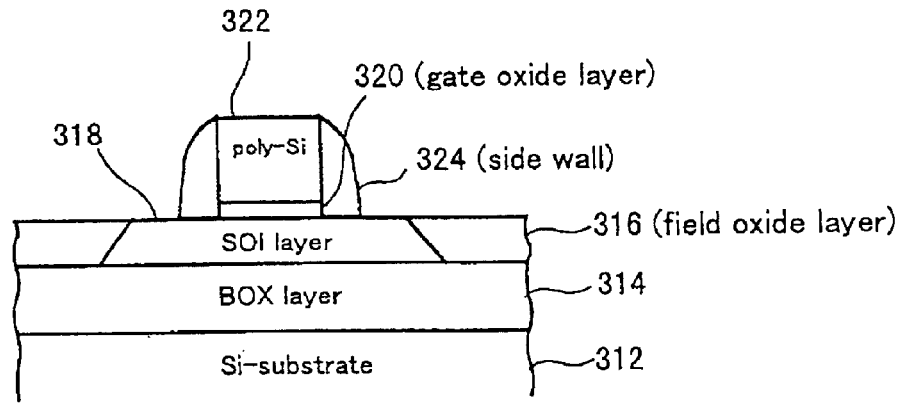
FIGS. 4A to 4E are cross-sectional views showing fabrication steps of a semiconductor device according to a third preferred embodiment of the present invention.

FIG. 4A shows a condition in which gate-side-wall process is completed. As shown in FIG. 4A, a BOX (Buried Oxide) layer 314 is formed on a silicon substrate 312 to have a thickness of 100 nm to 200 nm. A field oxide layer 316 and a SOI (Silicon on Insulator) layer 318 are formed on the BOX layer 314. The SOI layer 318 is of FD (Fully Depletion) type and is designed to have a thickness of 50 nm to 100 nm. A gate oxide layer 320 is formed on the SOI layer 318 to have a thickness of 3.5 nm to 7.0 nm. A poly-silicon gate layer 322 is formed on the gate oxide layer 320 to have a thickness of 150 nm to 250 nm. A gate side wall layer 324 is formed on the SOI layer 318 to surround the poly-silicon gate layer 322 and gate oxide layer 320. The gate side wall layer 324 is designed to have a width of 80 nm to 150 nm.

Figure 4B:
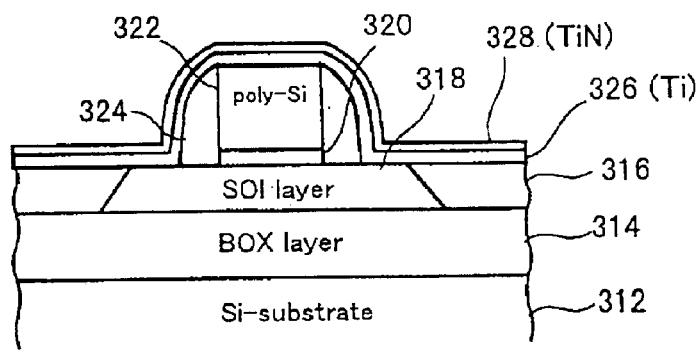

FIG. 4B shows a condition in that the structure, shown in FIG. 4A, is covered with Ti (titanium) layer 326 and TiN (Titanium Nitride) layer 328. The Ti layer 326 is formed over the entire structure, and the TiN layer 328 is formed over the Ti layer 326. The TiN layer 328 functions for controlling salicide process.

Figure 4C:
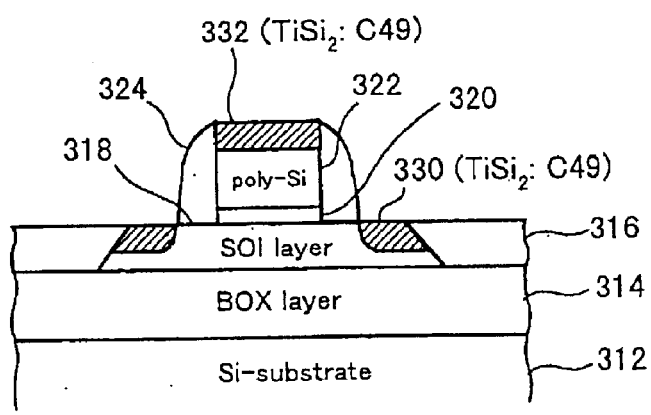

FIG. 4C shows a condition in that a first RTA (Rapid Thermal Annealing) process is carried out to the structure. The first RTA process is carried out at 500 to 600° C., so that silicide reaction occurs at the junction areas between the SOI layer 318 and the Ti layer 326, and between the poly-silicon gate layer 322 and the Ti layer 326. As a result of the first RTA process, silicide regions 330 and 332 are formed. The silicide regions 330 and 332 can be called "higher-reacted silicide regions" or "first-reacted silicide regions". The silicide regions 330 and 332 are of $TiSi_2$ (C49), which still have a higher resistance. A part of the silicide regions 330 and 332 does not become to be of $TiSi_2$ (C49) but of TiSi. After the first RTA process, the remaining metal (Ti and TiN) are selectively removed by a wet process using such as ammonia water or hydrogen peroxide solution.

Figure 4D:
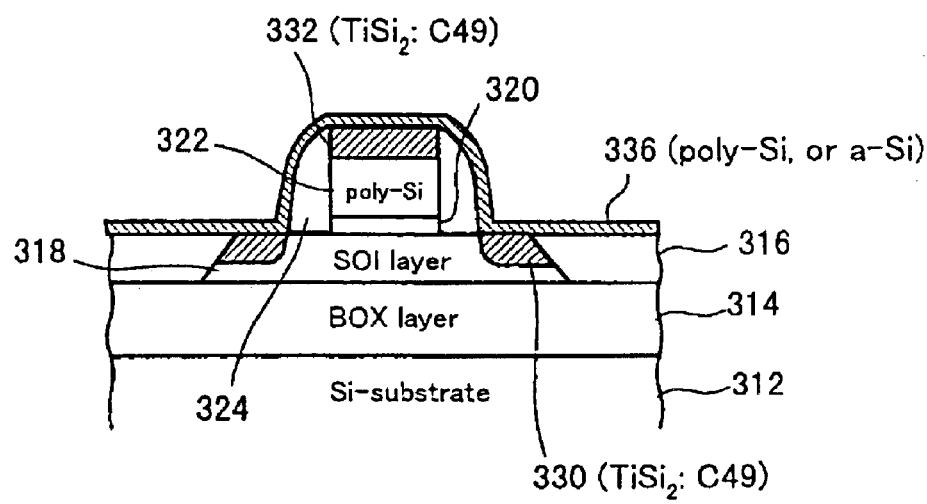

Before a second RTA process, a poly-Si (or a-Si) layer 336 is formed over the entire structure, as a supplemental silicon layer, as shown in FIG. 4D. Then, a second RTA process is carried out at a temperature of 800 to 850° C. In the second RTA process, phase transition of $TiSi_2$ (C49) to $TiSi_2$ (C54) occurs in the silicide regions 320 and 332, so that the resistance of the silicide regions 320 and 330 is lowered. In other words, silicide regions 338 and 340 of $TiSi_2$ (C54) are formed. Incomplete silicide regions of TiSi are changed into of $TiSi_2$. The silicide regions 338 and 340 can be called "lower-resistance silicide regions" or "second-reacted silicide regions".

Figure 4E:
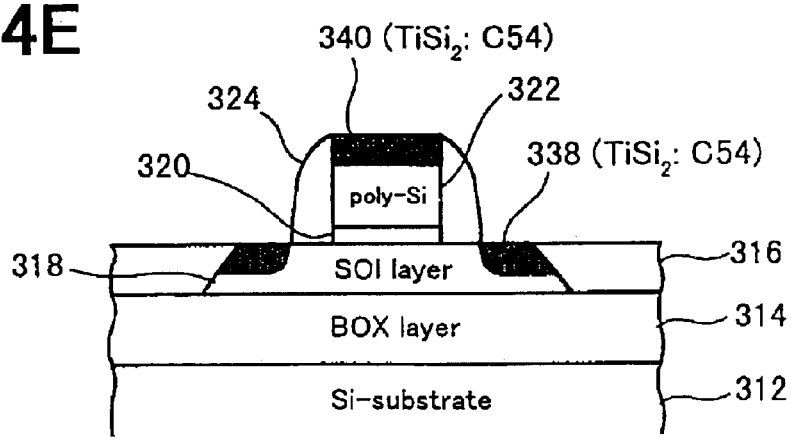

After the second RTA process, the remaining metal (Co, TiN and poly-Si/a-Si) are selectively removed, as shown in FIG. 4E. Such removing process can be carried out by a wet process (dipping) using aquafortis or by plasma etching using a chlorine system gas or a fluorine system gas.

According to the third preferred embodiment, silicon for silicide process is provided not only from the SOI layer 318 and the poly-silicon gate layer 322 but also from the poly-Si/a-Si layer 336. As a result, enough amount of silicon remains in the SOI layer 318 after the second RTA process; and therefore, low resistance wiring can be realized by the salicide process even if the SOI layer 318 is formed to be much thinner. In other words, the BOX layer 314 is prevented from being etched when contact holes are formed on the active area (330). Consequently, the fabricated semiconductor device is prevented from having a problem of electrical leakage.

FIGS. 5A to 5D are cross-sectional views showing fabrication steps of a semiconductor device according to a fourth preferred embodiment of the present invention. FIGS. 5A to 5D show salicide process of a SOI (Silicon on Insulator) type of semiconductor device. According to the fourth preferred embodiment, impurities, which are different between N-channel region and P-channel region, are doped into a supplemental silicon layer. In the above described first to third preferred embodiments, the same type of supplemental silicon layers (136, 236 and 336) are used both for N-channel region and P-channel region.

Figure 5A:
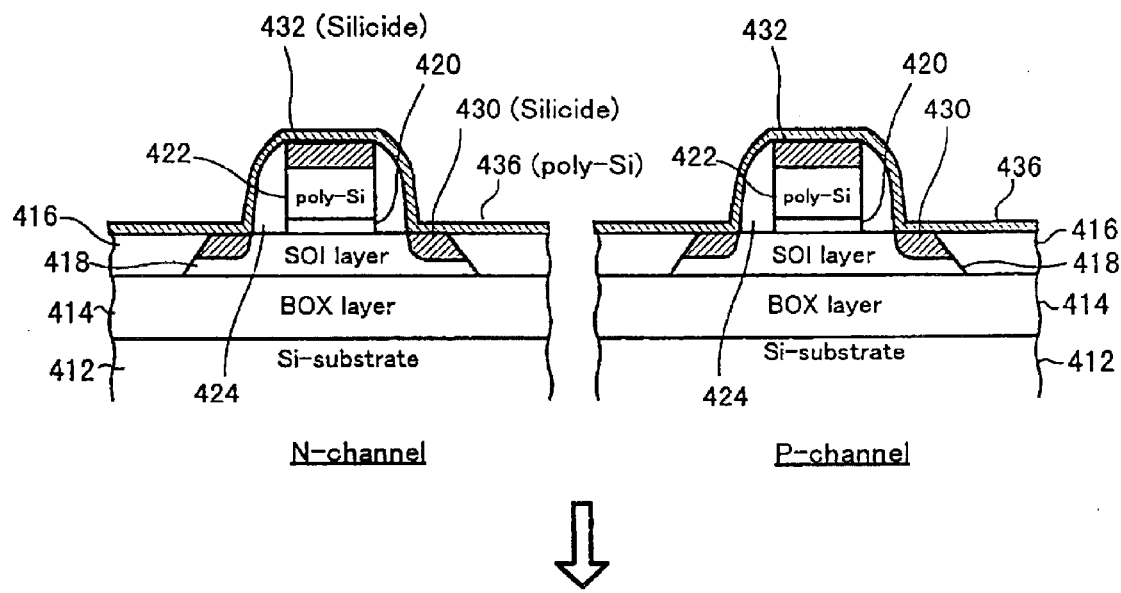
FIGS. 5A to 5D are cross-sectional views showing fabrication steps of a semiconductor device according to a fourth preferred embodiment of the present invention.

FIG. 5A shows a condition in which a first RTA process is completed and a supplemental silicon layer (436) is formed over the entire structure. As shown in FIG. 5A, a BOX (Buried Oxide) layer 414 is formed on a silicon substrate 412 to have a thickness of 100 nm to 200 nm. A field oxide layer 416 and a SOI (Silicon on Insulator) layer 418 are formed on the BOX layer 414. The SOI layer 418 is of FD (Fully Depletion) type and is designed to have a thickness of 50 nm to 100 nm. A gate oxide layer 420 is formed on the SOI layer 418 to have a thickness of 3.5 nm to 7.0 nm. A poly-silicon gate layer 422 is formed on the gate oxide layer 420 to have a thickness of 150 nm to 250 nm. A gate side wall layer 424 is formed on the SOI layer 418 to surround the poly-silicon gate layer 422 and gate oxide layer 420. The gate side wall layer 424 is designed to have a width of 80 nm to 150 nm.

Although not shown in FIG. 5A, the structure is covered with Co (cobalt) layer and TiN (Titanium Nitride) layer by sputtering process. The Co layer is formed over the structure to have a thickness of 5 nm to 12 nm. The TiN layer is formed over the Co layer to have a thickness of 5 nm to 10 nm. The TiN layer functions for controlling salicide process.

Next, a first RTA (Rapid Thermal Annealing) process is carried out at a temperature of 500 to 600° C., so that silicide reaction occurs at the junction area between the SOI layer 418 and the Co layer, and between the poly-silicon gate layer 422 and the Co layer. As a result of the first RTA process, silicide regions 430 and 432 are formed. The silicide regions 430 and 432 can be called "lower-resistance silicide regions" or "first-reacted silicide regions". The silicide regions 430 and 432 are of CoSi, which still have a higher resistance. After the first RTA process, the remaining metal (Co and TiN) are selectively removed by a wet process using such as ammonia water or hydrogen peroxide solution.

Before a second RTA process, a poly-Si layer 436 is formed over the entire structure, as a supplemental silicon layer, as shown in FIG. 5A.

Figure 5B:
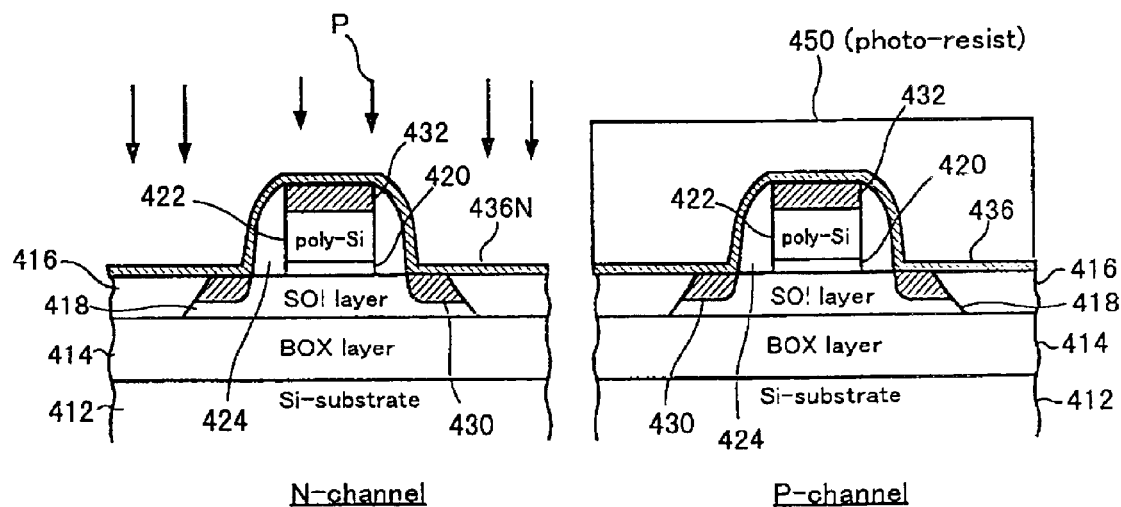

Next, the P-channel region is covered with a photo-resist layer 450, as shown in FIG. 5B. Then, N type impurity, such as P (phosphorus) or As (arsenic), is doped into the poly-Si layer 436 at the N-channel region by ion-implant technique to make a N-doped silicon layer 436N. In the doping process, the N type impurity is also doped into the photo-resist layer 450. After the doping process, the remaining photo-resist 450 is removed by a predetermined process.

Figure 5C:
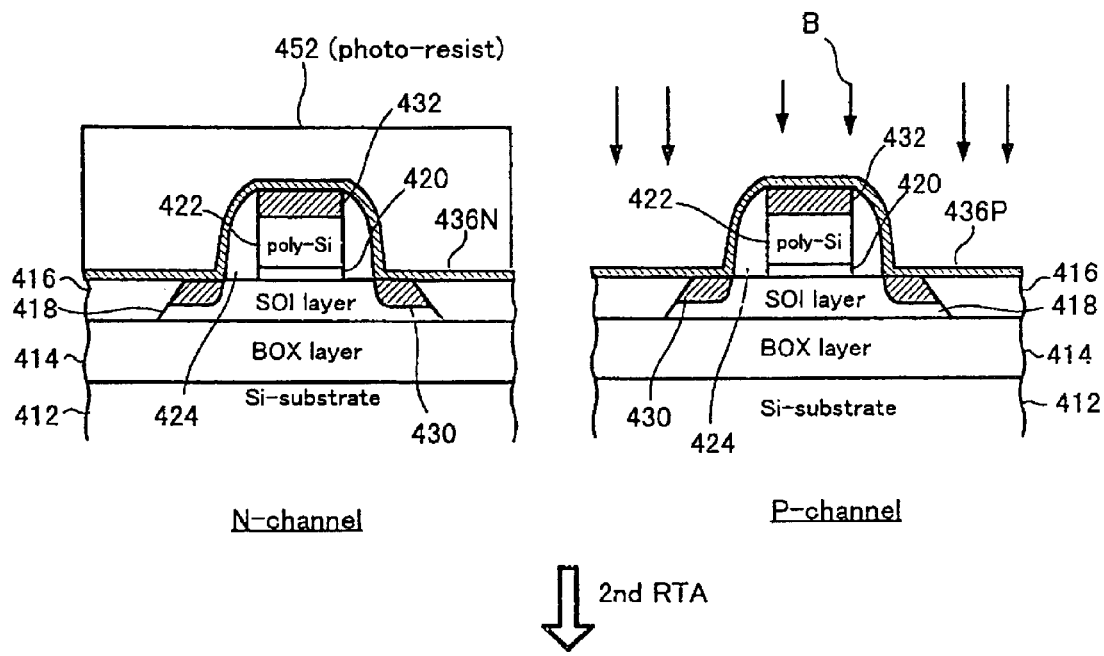

Next, the N-channel region is covered with a photo-resist layer 452, as shown in FIG. 5C. Then, P type impurity, such as B (boron), is doped into the poly-Si layer 436 at the P-channel region by ion-implant technique to make a P-doped silicon layer 436P. In the doping process, the P type impurity is also doped into the photo-resist layer 452. After the doping process, the remaining photo-resist 450 is removed by a predetermined process.

Figure 5D:
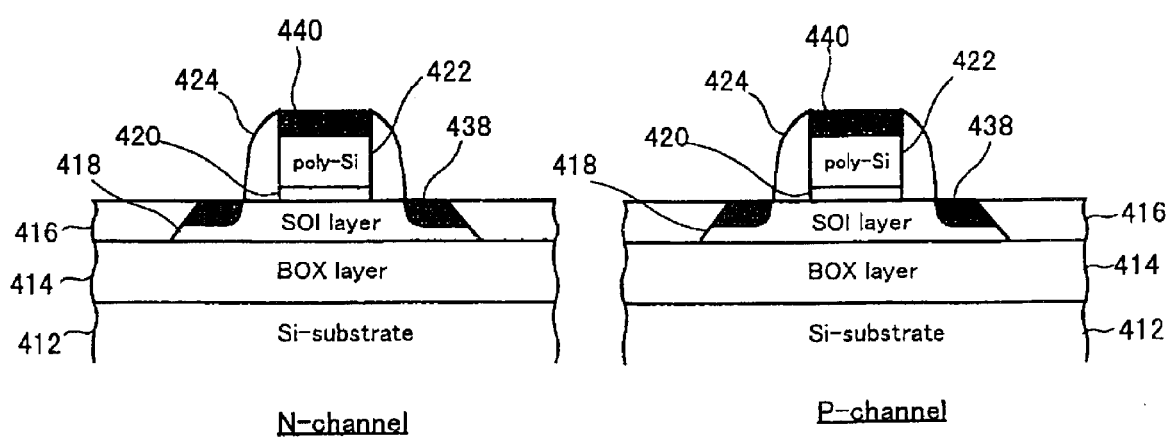

Next, a second RTA process is carried out to the entire structure, as shown in FIG. 5D. With the second RTA process, low resistance silicide regions 438 and 440 are formed, in the same manner as the first to third preferred embodiments. The silicide regions 438 and 440 can be called "lower-resistance silicide regions" or "second-reacted silicide regions". After the second RTA process, the remaining metal (Co, TiN and poly-Si/a-Si) are selectively removed by a wet process (dipping) using aquafortis or by plasma etching using a chlorine system gas or a fluorine system gas.

According to the fourth preferred embodiment of the present invention, impurities are doped into the supplemental silicon layer 436, so that the remaining silicon after the second RTA process can be removed at a high etching rate and high selectivity. Such advantage is especially good in the case of dry etching process. Further, the type of impurity doped into the supplemental silicon layer 436 is the same as that of the impurity doped into the corresponding active regions (430), so that the silicide reaction progresses smoothly.

Figure 6A:
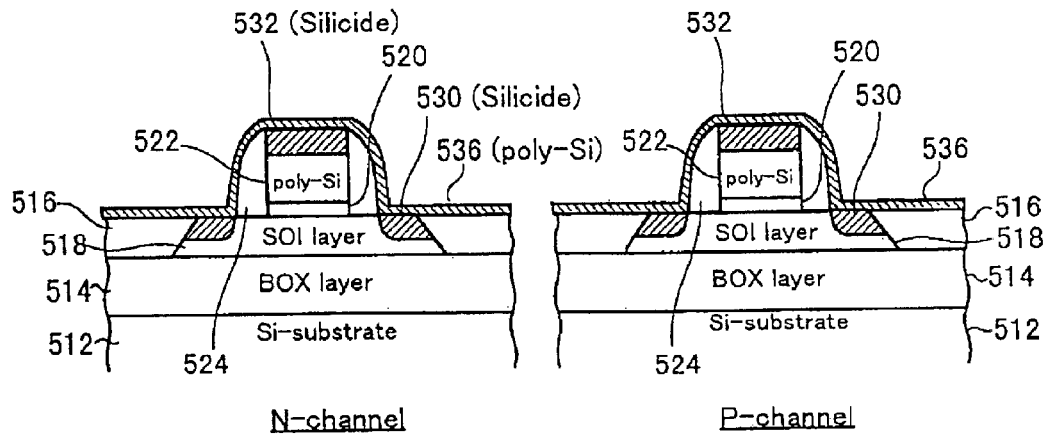
FIGS. 6A to 6C are cross-sectional views showing fabrication steps of a semiconductor device according to a fifth preferred embodiment of the present invention.
Figure 6B:
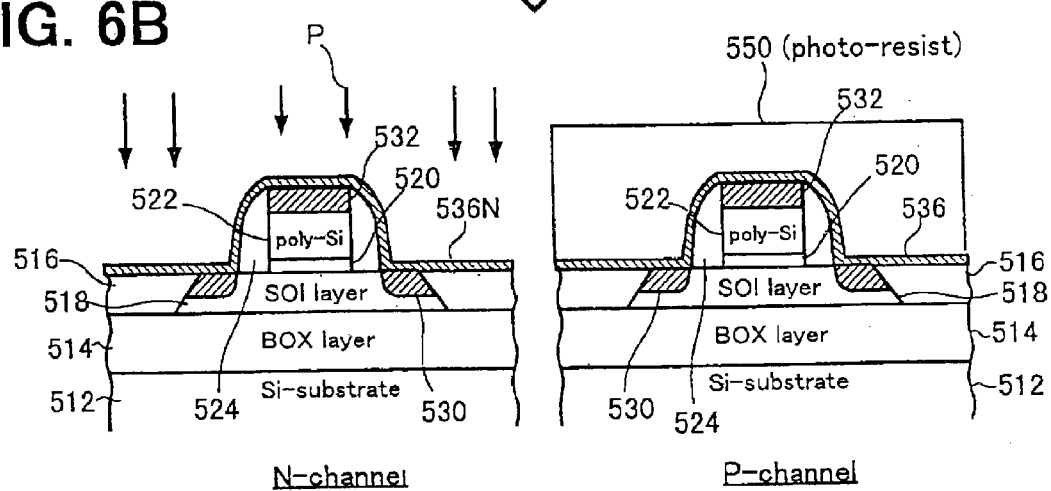
Figure 6C:
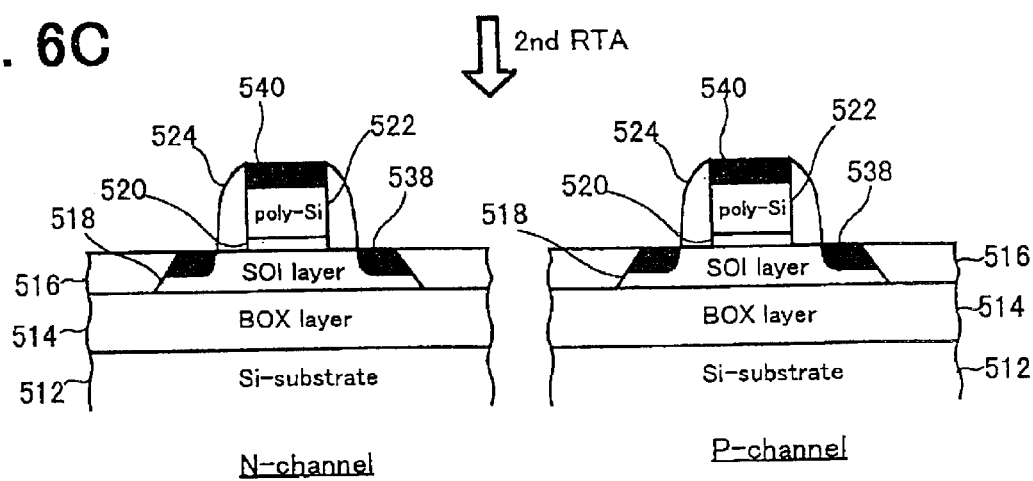

FIGS. 6A to 6C are cross-sectional views showing fabrication steps of a semiconductor device according to a fifth preferred embodiment of the present invention. FIGS. 6A to 6C show salicide process of a SOI (Silicon on Insulator) type of semiconductor device. According to the fifth preferred embodiment, impurity is doped into a supplemental silicon layer (536) only in a N-channel region. In the same manner, impurity can be doped into a supplemental silicon layer (536) only in a P-channel region.

FIG. 6A shows a condition in which a first RTA process is completed and a supplemental silicon layer (536) is formed over the entire structure. As shown in FIG. 6A, a BOX (Buried Oxide) layer 514 is formed on a silicon substrate 512 to have a thickness of 100 nm to 200 nm. A field oxide layer 516 and a SOI (Silicon on Insulator) layer 518 are formed on the BOX layer 514. The SOI layer 518 is of FD (Fully Depletion) type and is designed to have a thickness of 50 nm to 100 nm. A gate oxide layer 520 is formed on the SOI layer 518 to have a thickness of 3.5 nm to 7.0 nm. A poly-silicon gate layer 522 is formed on the gate oxide layer 520 to have a thickness of 150 nm to 250 nm. A gate side wall layer 524 is formed on the SOI layer 518 to surround the poly-silicon gate layer 522 and gate oxide layer 520. The gate side wall layer 524 is designed to have a width of 80 nm to 150 nm.

Then, in the same manner as the fourth preferred embodiment, a first RTA process is carried out. As a result of the first RTA process, silicide regions 530 and 532 are formed. The silicide regions 530 and 532 can be called "higher-resistance silicide regions" or "first-reacted silicide regions". The silicide regions 530 and 532 are of CoSi, which still have a higher resistance. After the first RTA process, the remaining metal (Co and TiN) are selectively removed by a wet process using such as ammonia water or hydrogen peroxide solution. Then, a poly-Si layer 536 is formed over the entire structure.

Next, the P-channel region is covered with a photo-resist layer 550, as shown in FIG. 6B. Then, N type impurity, such as P (phosphorus) or As (arsenic), is doped into the a-Si layer 536 at the N-channel region by ion-implant technique to make a N-doped silicon layer 536N. In the doping process, the N type impurity is also doped into the photo-resist layer 550. After the doping process, the remaining photo-resist 550 is removed by a predetermined process.

Next, a second RTA process is carried out to the entire structure, as shown in FIG. 6C. With the second RTA process, low resistance silicide regions 538 and 540 are formed, in the same manner as the first to fourth preferred embodiments. The silicide regions 538 and 540 can be called "lower-resistance silicide regions" or "second-reacted silicide regions". After the second RTA process, the remaining metal (Co, TiN and poly-Si/a-Si) are selectively removed by a wet process (dipping) using aquafortis or by plasma etching using a chlorine system gas or a fluorine system gas.

According to the fifth preferred embodiment of the present invention, impurity is doped into the supplemental silicon layer 536 in one of N and P channel regions, so that the silicide reaction can be well controlled between the N-channel region and P-channel region.

What is claimed is:

1. A method for fabricating a semiconductor device, comprising:
   providing a semiconductor substrate which has a silicon region located on an insulating layer formed in the semiconductor substrate;
   forming a metal layer on the silicon region of the semiconductor substrate;
   performing a first rapid thermal annealing on the semiconductor substrate to form first-reacted silicide regions;
   forming a supplemental silicon layer on the first-reacted silicide regions;
   doping an impurity into the supplemental silicon layer; and
   performing a second rapid thermal annealing to convert the first-reacted silicide regions into second-reacted silicide regions, by reaction of the supplemental silicon layer with the first-reacted silicide regions,
   the semiconductor device including a p-channel MOS transistor having p-type source and drain diffusion layers, and including an n-channel MOS transistor having n-type source and drain diffusion layers,
   said doping comprising doping the impurity into the supplemental silicon layer so that only the supplemental silicon layer formed over the p-channel MOS transistor is doped, or so that only the supplemental silicon layer formed over the n-channel MOS transistor is doped, and
   a thickness of the silicon region is in a range of 50–100 nm.

2. A method for fabricating a semiconductor device comprising:
   providing a silicon substrate;
   providing a buried oxide layer on the silicon substrate;
   providing a field oxide layer and a silicon on insulator layer on the buried oxide layer;
   providing a gate oxide layer on the silicon on insulator layer;
   providing a poly-silicon gate layer on the gate oxide layer;
   providing a gate side wall layer on the silicon on insulator layer to surround the poly-silicon gate layer and the gate oxide layer;
   providing a material to be silicided on a surface of the semiconductor device including the poly-silicon gate layer, the gate side wall layer, the silicon on insulator layer and the field oxide layer;
   performing a first rapid thermal annealing process to form first-reacted silicide regions in the poly-silicon gate layer and in source/drain active areas of the silicon on insulator layer;
   removing non-reacted material from the first-reacted silicide regions;
   providing a supplemental silicon layer over the surface of the semiconductor device after the non-reacted material is removed;
   doping the supplemental silicon layer; and
   performing a second rapid thermal annealing process to convert the first-reacted silicide regions into second-reacted silicide regions, by reaction of the supplemental silicon layer with the first-reacted silicide regions,
   the supplemental silicon layer preventing the poly-silicon gate layer and the silicon on insulator layer from being completely silicided,
   the semiconductor device including a p-channel MOS transistor having p-type source and drain regions, and including an n-channel MOS transistor having n-type source and drain regions,
   said doping comprising doping an impurity into the supplemental silicon layer so that only the supplemental silicon layer provided over the p-channel MOS transistor is doped, or so that only the supplemental silicon layer provided over the n-channel MOS transistor is doped, and
   a thickness of the silicon on insulator layer is in a range of 50–100 nm.

3. The method according to claim 2, wherein the material to be silicided comprises cobalt.

4. The method according to claim 2, wherein the material to be silicided comprises titanium.

5. The method according to claim 2, wherein the supplemental silicon layer is poly-silicon formed by a chemical vapor deposition technique.

6. The method according to claim 2, wherein the supplemental silicon layer is amorphous silicon formed by a sputtering technique.

7. The method according to claim 1, wherein the metal layer comprises cobalt.

8. The method according to claim 1, wherein the metal layer comprises titanium.

9. The method according to claim 1, wherein the supplemental silicon layer is poly-silicon formed by a chemical vapor deposition technique.

10. The method according to claim 1, wherein the supplemental silicon layer is amorphous silicon formed by a sputtering technique.

11. The method according to claim 1, further comprising:
selectively removing non-reacted silicon from the second-reacted silicide regions after the second rapid thermal annealing.

12. The method according to claim 2, further comprising:
selective removing non-reacted silicon from the second-reacted silicide region after the second rapid thermal annealing.

13. The method according to claim 1, wherein said doping comprises doping a p-type impurity into the supplemental silicon layer so that only the supplemental silicon layer over the p-channel MOS transistor is doped p-type.

14. The method according to claim 1, wherein said doping comprises doping an n-type impurity into the supplemental silicon layer so that only the supplemental silicon layer over the n-channel MOS transistor is doped n-type.

15. The method according to claim 2, wherein said doping comprises doping a p-type impurity into the supplemental silicon layer so that only the supplemental silicon layer over the p-channel MOS transistor is doped p-type.

16. The method according to claim 2, wherein said doping comprises doping an n-type impurity into the supplemental silicon layer so that only the supplemental silicon layer over the n-channel MOS transistor is doped n-type.

17. The method according to claim 1, wherein the thickness of the silicon region is in a range of 50–70 nm.

18. The method according to claim 2, wherein the thickness of the silicon on insulator layer is in a range of 50–70 nm.

* * * * *